(12) United States Patent
Miao

(10) Patent No.: US 11,296,181 B2
(45) Date of Patent: Apr. 5, 2022

(54) DISPLAY PANEL PACKAGING METHOD

(71) Applicant: Shenzhen China Star Optoelectronics Semiconductor Display Technology Co., Ltd., Guangdong (CN)

(72) Inventor: Yang Miao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 346 days.

(21) Appl. No.: 16/494,486

(22) PCT Filed: May 21, 2019

(86) PCT No.: PCT/CN2019/087762
§ 371 (c)(1),
(2) Date: Sep. 16, 2019

(87) PCT Pub. No.: WO2020/215421
PCT Pub. Date: Oct. 29, 2020

(65) Prior Publication Data
US 2021/0408217 A1    Dec. 30, 2021

(30) Foreign Application Priority Data
Apr. 26, 2019 (CN) .......................... 201910346447.7

(51) Int. Cl.
*H01L 27/32* (2006.01)
*H01L 51/50* (2006.01)
(Continued)

(52) U.S. Cl.
CPC ...... *H01L 27/3279* (2013.01); *H01L 51/5056* (2013.01); *H01L 51/5072* (2013.01);
(Continued)

(58) Field of Classification Search
CPC .......................................... H01L 51/0508–057
See application file for complete search history.

(56) References Cited

U.S. PATENT DOCUMENTS 9,070,895 B2 *   6/2015  Lin .......................... H01L 51/56
2006/0170341 A1 * 8/2006  Su ........................ H01L 51/5253
                                                                  313/512
(Continued)

FOREIGN PATENT DOCUMENTS

CN          1816232 A    *  8/2006
CN        104953044 A        9/2015
(Continued)

*Primary Examiner* — Mamadou L Diallo

(57) ABSTRACT

A display panel, a packaging method thereof, and a display device having same are described. The display panel has: a substrate having a display region and a non-display region surrounding the display region; electrode lines distributed on a surface of the substrate, and located within the display region; a package covering plate attached to the surface of the substrate having the electrode lines; a double-sided sealant adhered to the package covering plate and the surface of the substrate having the electrode lines; a conductive nanofiber layer disposed between the double-sided sealant and the substrate, and located on the electrode lines of the display region. The conductive nanofiber layer can achieve good surface contact and parallel connection with the electrode lines. Therefore, surface resistance of the electrode lines in the display panel is effectively reduced, and luminous efficiency and brightness uniformity of the display panel are improved.

4 Claims, 2 Drawing Sheets

(51) Int. Cl.
*H01L 51/52* (2006.01)
*H01L 51/56* (2006.01)

(52) U.S. Cl.
CPC ...... *H01L 51/5092* (2013.01); *H01L 51/5246* (2013.01); *H01L 51/56* (2013.01)

(56) References Cited

U.S. PATENT DOCUMENTS

| | | | | |
|---|---|---|---|---|
| 2011/0068492 A1* | 3/2011 | Chen | ................ | G02F 1/133305 |
| | | | | 264/1.7 |
| 2011/0123776 A1* | 5/2011 | Shin | ................ | B32B 27/28 |
| | | | | 428/172 |
| 2014/0217409 A1* | 8/2014 | Chaji | ................ | B82Y 10/00 |
| | | | | 257/57 |
| 2015/0129941 A1* | 5/2015 | Zhang | ................ | H01L 27/3274 |
| | | | | 257/288 |
| 2015/0359105 A1* | 12/2015 | Yoon | ................ | C09D 7/65 |
| | | | | 174/268 |
| 2016/0155970 A1* | 6/2016 | Chung | ................ | H01L 51/5296 |
| | | | | 257/40 |
| 2017/0155077 A1 | 6/2017 | Li et al. | | |
| 2017/0236650 A1* | 8/2017 | Freitag | ................ | H01L 51/4226 |
| | | | | 546/10 |
| 2017/0329368 A1* | 11/2017 | Rho | ................ | H04M 1/0262 |
| 2018/0198087 A1* | 7/2018 | Rosenberger | ....... | H01L 51/5212 |
| 2018/0261787 A1* | 9/2018 | Ishida | ................ | H01L 27/3262 |
| 2019/0058024 A1* | 2/2019 | Zeng | ................ | H01L 51/56 |
| 2019/0324323 A1* | 10/2019 | Oh | ................ | G02F 1/133611 |
| 2019/0326330 A1* | 10/2019 | Xia | ................ | H01L 27/1214 |
| 2020/0035954 A1* | 1/2020 | Yoshida | ................ | H05B 33/12 |
| 2020/0127201 A1* | 4/2020 | Li | ................ | H01L 51/0048 |
| 2020/0212154 A1* | 7/2020 | Kim | ................ | H01L 27/3248 |
| 2020/0222718 A1* | 7/2020 | Enwemeka | ........ | A61K 41/0061 |
| 2020/0251680 A1* | 8/2020 | Wang | ................ | H01L 51/5246 |
| 2020/0381508 A1* | 12/2020 | Jeon | ................ | H01L 51/5237 |
| 2020/0410910 A1* | 12/2020 | Jia | ................ | G09F 9/301 |
| 2021/0143222 A1* | 5/2021 | Song | ................ | H01L 27/3248 |
| 2021/0175296 A1* | 6/2021 | Liu | ................ | H01L 51/5056 |
| 2021/0225984 A1* | 7/2021 | Wang | ................ | H01L 27/3246 |
| 2021/0265584 A1* | 8/2021 | Fusella | ................ | H01Q 1/243 |

FOREIGN PATENT DOCUMENTS

| | | | |
|---|---|---|---|
| CN | 104982092 A | 10/2015 | |
| KR | 20180074857 A | 7/2018 | |
| WO | WO-2021055244 A1 * | 3/2021 | ............ D01F 9/12 |

* cited by examiner

DISPLAY PANEL PACKAGING METHOD

FIELD OF DISCLOSURE

The present disclosure relates to displays, and more particularly to a display panel, a packaging method thereof, and a display device having same.

BACKGROUND OF DISCLOSURE

Organic light-emitting diode (OLED) display devices have advantages of being self-illuminating without requiring a backlight, high contrast, wide color gamut, thin thickness, wide viewing angles, fast response speed, and being usable for flexible panels. It is considered to be a new generation of flat display technology.

Since the OLED display devices adopt a current-driven driving method, resistance of surface electrodes in the OLED display devices greatly affects luminous efficiency and brightness uniformity of OLED display panels. Therefore, it has also become a major challenge in development of OLED display devices to reduce resistance of the surface electrodes in the OLED display devices.

SUMMARY OF DISCLOSURE

In order to solve above technical problems, the present disclosure provides a display panel, a packaging method thereof, and a display device having same. The conductive nanofiber layer is added in the package structure layer, so that the conductive nanofiber layer can achieve good surface contact and parallel connection with the electrode lines. Therefore, surface resistance of electrode lines in the display panel is effectively reduced, and luminous efficiency and brightness uniformity of the display panel are improved.

The technical solutions to solve the above problems art that: the present disclosure provides a display panel comprising: a substrate having a display region and a non-display region surrounding the display region; electrode lines distributed and exposed on a surface of the substrate, wherein the electrode lines are located within the display region; a package covering plate covering the surface of the substrate having the electrode lines; a surface of the double-sided sealant is adhered to the package covering plate, and another surface of the double-sided sealant is adhered to the surface of the substrate having the electrode lines, wherein the double-sided sealant is configured to seal between the substrate and the package covering plate; and a conductive nanofiber layer disposed between the double-sided sealant and the substrate, wherein the conductive nanofiber layer is located on the electrode lines of the display region.

In an embodiment of the present disclosure, the substrate comprises a thin film transistor structure layer, and an organic light-emitting diode (OLED) device disposed on the thin film transistor structure layer and located within the display region, wherein the electrode lines are located in the OLED device.

In an embodiment of the present disclosure, the OLED device further comprises a reflective electrode disposed on the thin film transistor structure layer, a hole injection layer disposed on the reflective electrode, a hole transport layer disposed on the hole injection layer, a light-emitting layer disposed on the hole transport layer, an electron transport layer disposed on the light-emitting layer, and an electron injection layer disposed on the electron transport layer, wherein the electrode lines are disposed on the electron injection layer.

In an embodiment of the present disclosure, the conductive nanofiber layer has an electrical conductivity of $10 \times 10^6$ Siemens/m to $100 \times 10^6$ Siemens/m and a light transmittance of 70% to 95%.

In an embodiment of the present disclosure, the conductive nanofiber layer comprises at least one of a nanometal material, a graphene material, and a carbon nanotube.

The present disclosure further provides a packaging method of a display panel, comprising steps of:

providing a substrate, a package covering plate, and a double-sided sealant, wherein the substrate has a display region and a non-display region surrounding the display region, and the substrate is provided with electrode lines, wherein the electrode lines are distributed and exposed on a surface of the substrate, and the electrode lines are located within the display region;

removing a protective film on a surface of the double-sided sealant, vacuum-attaching the surface of the double-sided sealant to a surface of the package covering plate, and removing a protective film on another surface of the double-sided sealant;

forming a conductive nanofiber layer on the another surface of the double-sided sealant;

vacuum-attaching the substrate and the package covering plate by the double-sided sealant sealing therebetween, wherein the conductive nanofiber layer faces towards the substrate and is located within the display region; and curing the double-sided sealant.

In an embodiment of the present disclosure, in the step of forming the conductive nanofiber layer on another surface of the double-sided sealant, a conductive nanofiber material is sprayed onto the another surface of the double-sided sealant by electrospinning or electrostatic spraying.

In an embodiment of the present disclosure, the step of providing the substrate comprises:

fabricating a thin film transistor structure layer; and fabricating a reflective electrode on the thin film transistor structure layer; forming a hole injection layer on the reflective electrode; forming a hole transport layer on the hole injection layer; forming a light-emitting layer on the hole transport layer; forming an electron transport layer on the light-emitting layer; forming an electron injection layer on the electron transport layer; forming the electrode lines on the electron injection layer, wherein the reflective electrode, the hole injection layer, the hole transport layer, the light-emitting layer, the electron transport layer, the electron injection layer, and the electrode lines constitute an organic light-emitting diode (OLED) device, wherein in the step of vacuum-attaching the substrate and the package covering plate by the double-sided sealant sealing therebetween, the conductive nanofiber layer faces towards the substrate and covers the electrode lines.

In an embodiment of the present disclosure, the step of curing the double-sided sealant comprises: heating and pressing the display panel by hot pressing and heating the double-sided sealant by a heating device to melt and then cure the double-sided sealant.

The present disclosure further provides a display device comprising the above described display panel.

The present disclosure provides a display panel, a packaging method thereof, and a display device having same. The conductive nanofiber layer is added in the package structure layer, so that the conductive nanofiber layer can achieve good surface contact and parallel connection with the electrode lines. Therefore, surface resistance of electrode lines in the display panel is effectively reduced, and luminous efficiency and brightness uniformity of the display panel are improved. Simultaneously, since conductive nanofibers can be materials having good light transmittance such as nano silver, graphene and carbon nanotubes, light-emitting and display performance of the display panel are not affected, especially for the display panel with a top-emitting OLED device.

DESCRIPTION OF DRAWINGS

In order to more clearly describe technical solutions in embodiments of the present disclosure, drawings required to be used for the embodiments are simply described hereinafter. Apparently, the drawings described below only illustrate some embodiments of the present disclosure. Those skilled in the art can obtain other drawings based on these drawings disclosed herein without creative effort.

The present disclosure will be further explained below in conjunction with the drawings and embodiments.

REFERENCE NUMERALS

Figure 1:
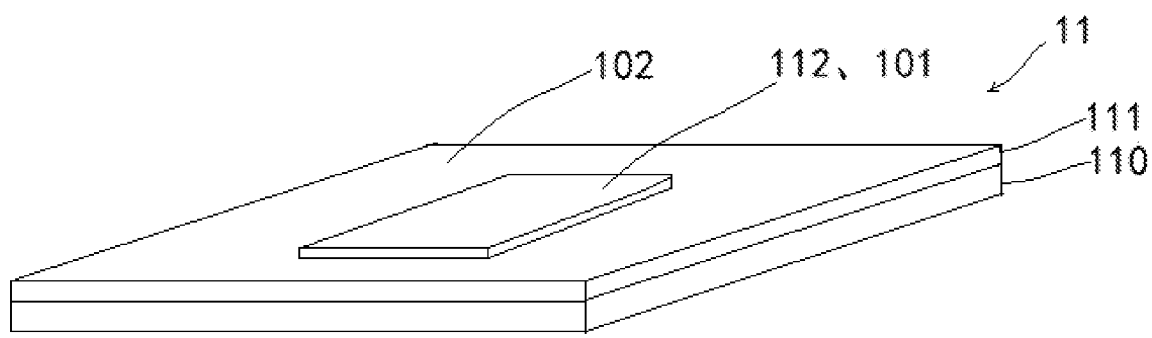
FIG. 1 is a structural diagram of a substrate according to an embodiment of the present disclosure, mainly showing a display region, a non-display region, and a distribution region of an OLDE device.

| | |
|---|---|
| 1: display panel | 100: display device |
| 101: display region | 102: non-display region |
| 11: substrate | 12: package covering plate |
| 13: double-sided sealant | 14: conductive nanofiber layer |
| 110: glass substrate | |
| 111: thin film transistor structure layer | |
| 112: organic light-emitting diode (OLED) device | |
| 1120: first electrode | 1121: hole injection layer |
| 1122: hole transport layer | 1123: light-emitting layer |
| 1124: electron transport layer | 1125: electron injection layer |
| 1126: second electrode, electrode wire | |

DETAILED DESCRIPTION OF PREFERRED EMBODIMENTS

Embodiments of the present disclosure are described in detail below, and examples of the embodiments are illustrated in the drawings, wherein the same or similar reference numerals indicate the same or similar elements or elements having the same or similar functions. The embodiments described below with reference to the drawings are intended to be illustrative of the disclosure and are not to be construed as limiting.

The following description of the embodiments is intended to be illustrative of the specific embodiments. Directional terms mentioned in the present disclosure, such as "upper", "lower", "front", "back", "left", "right", "top", "bottom", etc., are only directions by referring to the accompanying drawings. Thus, the used directional terms are used to describe and understand the present disclosure rather than limiting the present disclosure.

Figure 4:
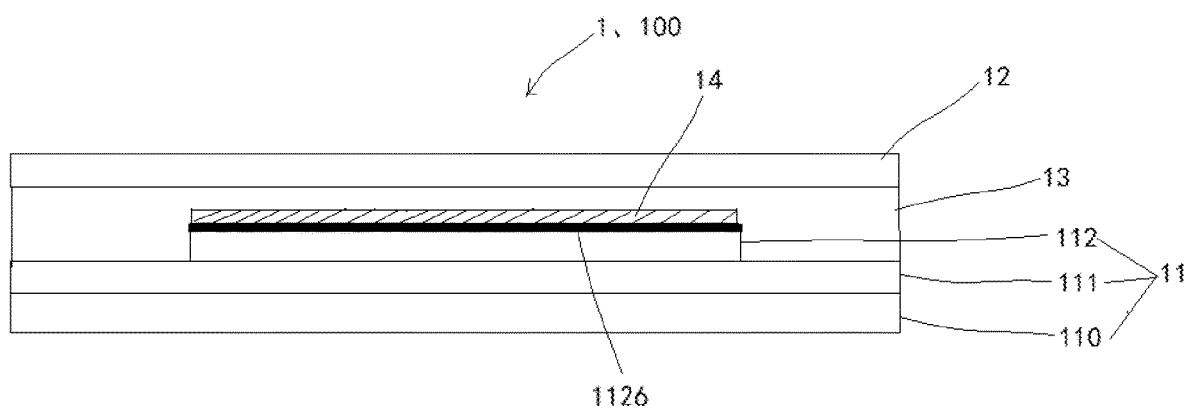
FIG. 4 is a structural diagram of a display panel according to an embodiment of the present disclosure.

As shown in FIG. 4, in an embodiment, a display panel 1 of the present disclosure includes a substrate 11, electrode lines 12, a package covering plate 13, and a double-sided sealant 14.

Figure 2:
FIG. 2 is a layered diagram of a substrate according to an embodiment of the present disclosure, mainly showing a structure of an OLDE device.

Referring to FIG. 1, FIG. 2, and FIG. 4, the substrate 11 has a display region 101 and a non-display region 102 surrounding the display region 101. Electrode lines 1126 are distributed and exposed on a surface of the substrate 11. The substrate includes a glass substrate 110, a thin film transistor structure layer 111, and an organic light-emitting diode (OLED) device 112. The thin film transistor structure layer 111 is disposed on the glass substrate 110. The OLED device 112 is disposed on the thin film transistor structure layer 111 and located within the display region 101. Since the layered structure constituting the thin film transistor structure layer 111 is not the focus of the present disclosure, it is not shown in the drawings. Here, only the structure constituting the thin film transistor structure layer 111 is briefly described. For example, in the display region 101, a specific structure of the thin film transistor structure layer 111 generally includes an active layer, a gate insulating layer, a gate electrode, an interlayer dielectric layer, a source electrode, a drain electrode, and a contact hole. The active layer is disposed on a buffer layer. The active layer has a source region and a drain region. The gate insulating layer covers the active layer and the buffer layer. The gate electrode is disposed on the gate insulating layer. The interlayer dielectric layer covers the gate electrode and the gate insulating layer. The contact hole penetrates from the interlayer dielectric layer to the active layer, wherein one of the contact holes is aligned with the source region, and another one of the contact holes is aligned with the drain region. The source electrode and the drain electrode are disposed on the interlayer dielectric layer. The source electrode is connected to the source region from the aligned contact hole, and the drain electrode is connected to the drain region from the aligned contact hole. Of course, in the present embodiment, the substrate 11 may further include a flat layer. The flat layer covers the source electrode, the drain electrode, and the interlayer dielectric layer. A pixel definition layer is disposed on the flat layer. The pixel defining layer has a slot therein.

Referring to FIG. 2, the thin film transistor structure layer 111 within the display region 101 is disposed with an organic light-emitting diode (OLED) device 112. More specifically, the OLED device 112 is disposed on the plat layer of the substrate 11 and is located in the slot. The electrode lines 1126 is located within the OLED device 112, i.e., a specific structure of the OLED device 112 includes a first electrode 1120, a hole injection layer 1121, a hole transport layer 1122, a light-emitting layer 1123, an electron transport layer 1124, an electron injection layer 1125, and a second electrode 1126. In the present embodiment, the first electrode 1120 is an anode disposed on the flat layer and connected to the drain electrode. The hole injection layer 1121, the hole transport layer 1122, the light-emitting layer 1123, the electron transport layer 1124, the electron injection layer 1125, and the second electrode 1126 are sequentially disposed on the first electrode 1120. The second electrode 1126 is a cathode. In this embodiment, the second electrode 1126 is the electrode lines 1126, and the OLED device 112 is a top light-emitting structure, that is, the second electrode 1126 is a transparent electrode, and the first electrode 1120 is a reflective electrode.

Figure 3:
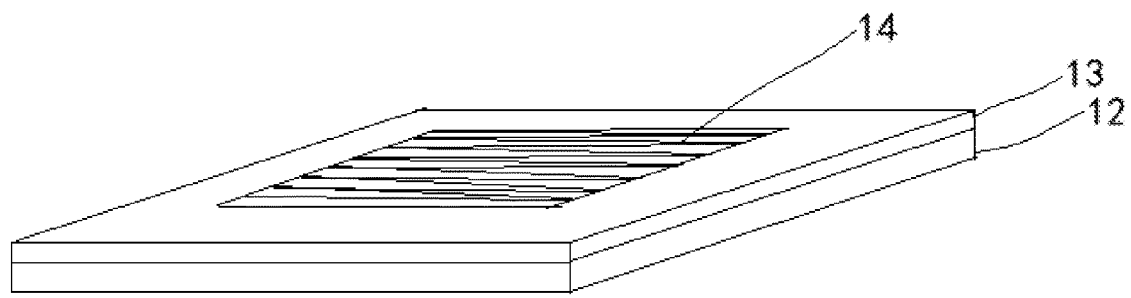
FIG. 3 is a structural diagram of a package covering plate having a double-sided sealant and a conductive nanofiber layer according to an embodiment of the present disclosure, mainly showing a distribution region of the double-sided sealant and the conductive nanofiber layer.

Referring to FIG. 3 and FIG. 4, the package covering plate 12 covers and is attached to a surface of the substrate 11 with the electrode lines 1126. A surface of the double-sided sealant 13 is adhered to a surface of the package covering plate 12 facing the substrate 11, and another surface of the double-sided sealant 12 is adhered to the surface of the substrate 11 having the electrode lines 1126. A conductive nanofiber layer is disposed between the double-sided sealant 13 and the substrate 11, wherein the conductive nanofiber layer is located on the electrode lines 1126 of the display region 101. In the present embodiment, the double-sided sealant 13 completely covers the display region 101 and is configured to seal between the substrate 11 and the package covering plate 12.

The conductive nanofiber layer has an electrical conductivity of $10 \times 10^6$ Siemens/m to $100 \times 10^6$ Siemens/m and a light transmittance of 70% to 95%. In the present embodiment, the conductive nanofiber layer 14 includes at least one of a nanometal material, a graphene material, and a carbon nanotube. Since the conductive nanofiber layer 14 has high electrical conductivity, i.e., electrical resistance is small, and after the conductive nanofiber layer 14 is attached to the electrode lines 1126, the conductive nanofiber layer 14 is connected in parallel with the electrode lines 1126, thereby effectively reducing surface resistance of the electrode lines 1126 in the display panel 1, and luminous efficiency and brightness uniformity of the display panel 1 are improved. Simultaneously, the conductive nanofiber layer 14 has high light transmittance, surface resistance can be lowered, and a light-emitting rate of the display panel 1 can be improved without affecting display of the display panel 1.

The present disclosure is described in more detail below by a packaging method of the display panel 1. The present disclosure also provides a packaging method of the display panel 1 comprising the following steps.

Refer to FIG. 1 and FIG. 2. A substrate 11, a package covering plate 12, and a double-sided sealant 13 are provided. The substrate 11 has a display region 101 and a non-display region 102 surrounding the display region 101, and the substrate 11 is provided with electrode lines 1126, wherein the electrode lines 1126 are distributed and exposed on a surface of the substrate 11, and the electrode lines 1126 are located within the display region 101. Specifically, the step of providing the substrate 11 includes fabricating a thin film transistor structure layer 111. A specific structure of the thin film transistor structure layer 111 can be referred to the above description, and will not be further described herein. An OLED device 112 is fabricated on the thin film transistor structure layer 111. A step of fabricating the OLED device 112 comprises steps of: forming a first electrode 1120 on the thin film transistor structure layer 111; forming a hole injection layer 1121 on the first electrode 1120; forming a hole transport layer 1122 on the hole injection layer 1121; forming a light-emitting layer 1123 on the hole transport layer 1122; forming an electron transport layer 1124 on the light-emitting layer 1123; forming an electron injection layer 1125 on the electron transport layer 1124; forming electrode lines 1126 on the electron injection layer 1125, wherein the first electrode 1120, the hole injection layer 1121, the hole transport layer 1122, the light-emitting layer 1123, the electron transport layer 1124, the electron injection layer 1125, and the electrode lines 1126 constitute the OLED device 112. A specific structure of the substrate 11 can be referred to above.

Refer to FIG. 3. A protective film on a surface of the double-sided sealant 13 is removed, the surface of the double-sided sealant 13 is vacuum-attached to a surface of the package covering plate 12, and a protective film on another surface of the double-sided sealant 13 is removed.

Refer to FIG. 3. A conductive nanofiber layer is formed on another surface of the double-sided sealant. In the embodiment, a conductive nanofiber material is sprayed onto the another surface of the double-sided sealant 13 by electrospinning or electrostatic spraying.

Refer to FIG. 4. The substrate 11 and the package covering plate 12 are vacuum-attached by sealing the double-sided sealant 13 therebetween, wherein the conductive nanofiber layer faces towards the substrate 11 and is located within the display region 101. In this embodiment, the conductive nanofiber layer faces towards the substrate 11 and covers the electrode lines 1126 of the OLED device 112.

The double-sided sealant 13 is cured. In the present embodiment, the display panel is heated and pressed by hot pressing and the double-sided sealant is heated by a heating device to melt and then cure the double-sided sealant 13.

Referring to FIG. 4, the present disclosure also provides a display device 100 including the display panel 1. A main protection point of the display device 100 of the present disclosure is the display panel 1, and specifically is a packaging structure of the display panel 1. As for other structures of the display device 100, such as a color filter substrate, etc., which are not described again.

The above are only preferred embodiments of the present disclosure, and are not intended to limit the present disclosure. Any modifications, equivalents, and improvements made within the spirit and scope of the present disclosure should be included within the scope of the present disclosure.

The invention claimed is:

1. A packaging method of a display panel, comprising steps of:

providing a substrate, a package covering plate, and a double-sided sealant, wherein the substrate has a display region and a non-display region surrounding the display region, and the substrate is provided with electrode lines, wherein the electrode lines are distributed and exposed on a surface of the substrate, and the electrode lines are located within the display region;

removing a protective film on a surface of the double-sided sealant, vacuum-attaching the surface of the double-sided sealant to a surface of the package covering plate, and removing a protective film on another surface of the double-sided sealant;

forming a conductive nanofiber layer on the another surface of the double-sided sealant;

vacuum-attaching the substrate and the package covering plate by the double-sided sealant sealing therebetween, wherein the conductive nanofiber layer faces towards the substrate and is located within the display region; and curing the double-sided sealant.

2. The packaging method of the display panel according to claim 1, wherein in the step of forming the conductive nanofiber layer on another surface of the double-sided sealant, a conductive nanofiber material is sprayed onto the another surface of the double-sided sealant by electrospinning or electrostatic spraying.

3. The packaging method of the display panel according to claim 1, wherein the step of providing the substrate comprises:

fabricating a thin film transistor structure layer; and fabricating a reflective electrode on the thin film transistor structure layer; forming a hole injection layer on reflective electrode; forming a hole transport layer on the hole injection layer; forming a light-emitting layer on the hole transport layer; forming an electron transport layer on the light-emitting layer; forming an electron injection layer on the electron transport layer; forming the electrode lines on the electron injection layer, wherein the reflective electrode, the hole injection layer, the hole transport layer, the light-emitting layer, the electron transport layer, the electron injection layer, and the electrode lines constitute an organic light-emitting diode (OLED) device, wherein in the step of vacuum-attaching the substrate and the package covering plate by the double-sided sealant sealing therebetween, the conductive nanofiber layer faces towards the substrate and covers the electrode lines.

4. The packaging method of the display panel according to claim 3, wherein the step of curing the double-sided sealant comprises: heating and pressing the display panel by hot pressing and heating the double-sided sealant by a heating device to melt and then cure the double-sided sealant.

* * * * *